United States Patent
Kwon et al.

(10) Patent No.: US 12,439,610 B2
(45) Date of Patent: Oct. 7, 2025

(54) MEMORY DEVICES

(71) Applicant: Samsung Electronics Co., Ltd., Suwon-si (KR)

(72) Inventors: Segab Kwon, Seoul (KR); Hyoshin Ahn, Seoul (KR); Daesin Kim, Suwon-si (KR); Inkook Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 499 days.

(21) Appl. No.: 17/872,634

(22) Filed: Jul. 25, 2022

(65) Prior Publication Data

US 2023/0048180 A1 Feb. 16, 2023

(30) Foreign Application Priority Data

Aug. 10, 2021 (KR) .................. 10-2021-0105480

(51) Int. Cl.
*H10B 63/00* (2023.01)

(52) U.S. Cl.
CPC ............. *H10B 63/24* (2023.02); *H10B 63/84* (2023.02)

(58) Field of Classification Search
CPC ................................ H10B 63/24; H10B 63/84
See application file for complete search history.

(56) References Cited

U.S. PATENT DOCUMENTS

| | | | |
|---|---|---|---|
| 8,507,889 B2 | 8/2013 | Nagashima | |
| 10,163,977 B1 | 12/2018 | Fantini et al. | |
| 10,186,552 B2* | 1/2019 | Choi | G11C 13/0004 |
| 10,403,681 B2 | 9/2019 | Ahn et al. | |
| 10,529,777 B2 | 1/2020 | Sei et al. | |
| 10,615,341 B2 | 4/2020 | Lee et al. | |
| 11,329,220 B2 | 5/2022 | Park et al. | |
| 11,616,197 B2 | 3/2023 | Lee et al. | |
| 2016/0093804 A1* | 3/2016 | Petz | H10N 70/231 |
| | | | 257/4 |
| 2017/0244026 A1 | 8/2017 | Wu et al. | |

(Continued)

FOREIGN PATENT DOCUMENTS

| | | |
|---|---|---|
| JP | 2020161723 A | 10/2020 |
| JP | 2021005611 A | 1/2021 |

(Continued)

*Primary Examiner* — William B Partridge
*Assistant Examiner* — Megan Parrish
(74) *Attorney, Agent, or Firm* — Wolf, Greenfield & Sacks, P.C.

(57) ABSTRACT

A memory device includes a plurality of first conductive lines on a substrate and extending in a first direction, a plurality of second conductive lines on the plurality of first conductive lines and extending in a second direction intersecting the first direction, and a plurality of memory cells respectively between the plurality of first conductive lines and the plurality of second conductive lines. Each of the plurality of memory cells includes a switching element and a variable resistance material layer. The switching element includes a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

20 Claims, 16 Drawing Sheets

(56) References Cited

U.S. PATENT DOCUMENTS

| | | | |
|---|---|---|---|
| 2017/0250222 A1* | 8/2017 | Wu | H10B 63/20 |
| 2017/0316822 A1 | 11/2017 | Sei et al. | |
| 2019/0006586 A1 | 1/2019 | Maes et al. | |
| 2020/0194667 A1* | 6/2020 | Park | H10B 63/22 |
| 2021/0193922 A1* | 6/2021 | Lee | H10B 63/20 |

FOREIGN PATENT DOCUMENTS

| | | |
|---|---|---|
| KR | 20100106212 A | 10/2010 |
| KR | 20180109287 A | 10/2018 |
| KR | 10-2019-0004163 A | 1/2019 |
| KR | 20210027781 A | 3/2021 |
| KR | 20210081783 A | 7/2021 |

* cited by examiner

MEMORY DEVICES

CROSS-REFERENCE TO RELATED APPLICATION

This application is based on and claims priority under 35 U.S.C. § 119 to Korean Patent Application No. 10-2021-0105480, filed on Aug. 10, 2021, in the Korean Intellectual Property Office, the disclosure of which is incorporated by reference herein in its entirety.

BACKGROUND

The present disclosure relates to memory devices. As electronic products have generally become lighter, thinner, shorter, and/or smaller, demand for high integration of semiconductor devices has increased. In addition, a three-dimensional memory device including a variable resistance material layer and a switching element and having a cross point structure has been suggested. A chalcogenide material having an ovonic threshold switching (OTS) characteristic has been suggested as the switching element for the three-dimensional memory device.

SUMMARY

The inventive concept relates to an eco-friendly memory device having low leakage current and improved reliability.

According to an aspect of the inventive concept, there is provided a memory device including a plurality of first conductive lines on a substrate and extending in a first direction, a plurality of second conductive lines on the plurality of first conductive lines and extending in a second direction intersecting the first direction, and a plurality of memory cells respectively between the plurality of first conductive lines and the plurality of second conductive lines. Each of the plurality of memory cells includes a switching element and a variable resistance material layer. The switching element includes a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

According to an aspect of the inventive concept, there is provided a memory device including a plurality of first word lines on a substrate and extending in a first direction, a plurality of first bit lines at a vertical level higher than that of the plurality of first word lines and extending in a second direction intersecting the first direction, a plurality of second word lines at a vertical level higher than that of the plurality of first bit lines and extending in the first direction, and a plurality of memory cells. The plurality of memory cells includes a plurality of first memory cells respectively between the plurality of first word lines and the plurality of first bit lines. Moreover, the plurality of memory cells includes a plurality of second memory cells respectively between the plurality of first bit lines and the plurality of second word lines. Each of the plurality of memory cells includes a switching element and a variable resistance material layer. The switching element includes a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

According to an aspect of the inventive concept, there is provided a memory device including a lower structure on a substrate and including a peripheral circuit, a plurality of first conductive lines on the lower structure and extending in a first direction parallel with a top surface of the substrate, a plurality of second conductive lines on the plurality of first conductive lines and extending in a second direction intersecting the first direction, a plurality of first memory cells respectively between the plurality of first conductive lines and the plurality of second conductive lines, a plurality of third conductive lines on the plurality of second conductive lines and extending in the first direction, and a plurality of second memory cells respectively between the plurality of second conductive lines and the plurality of third conductive lines. Each of the plurality of first memory cells and the plurality of second memory cells includes a bottom electrode, a switching element, a middle electrode, a variable resistance material layer, and a top electrode sequentially stacked in a third direction perpendicular to the top surface of the substrate. The switching element includes a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, example embodiments of the inventive concept will be described in detail with reference to the accompanying drawings.

Figure 1:
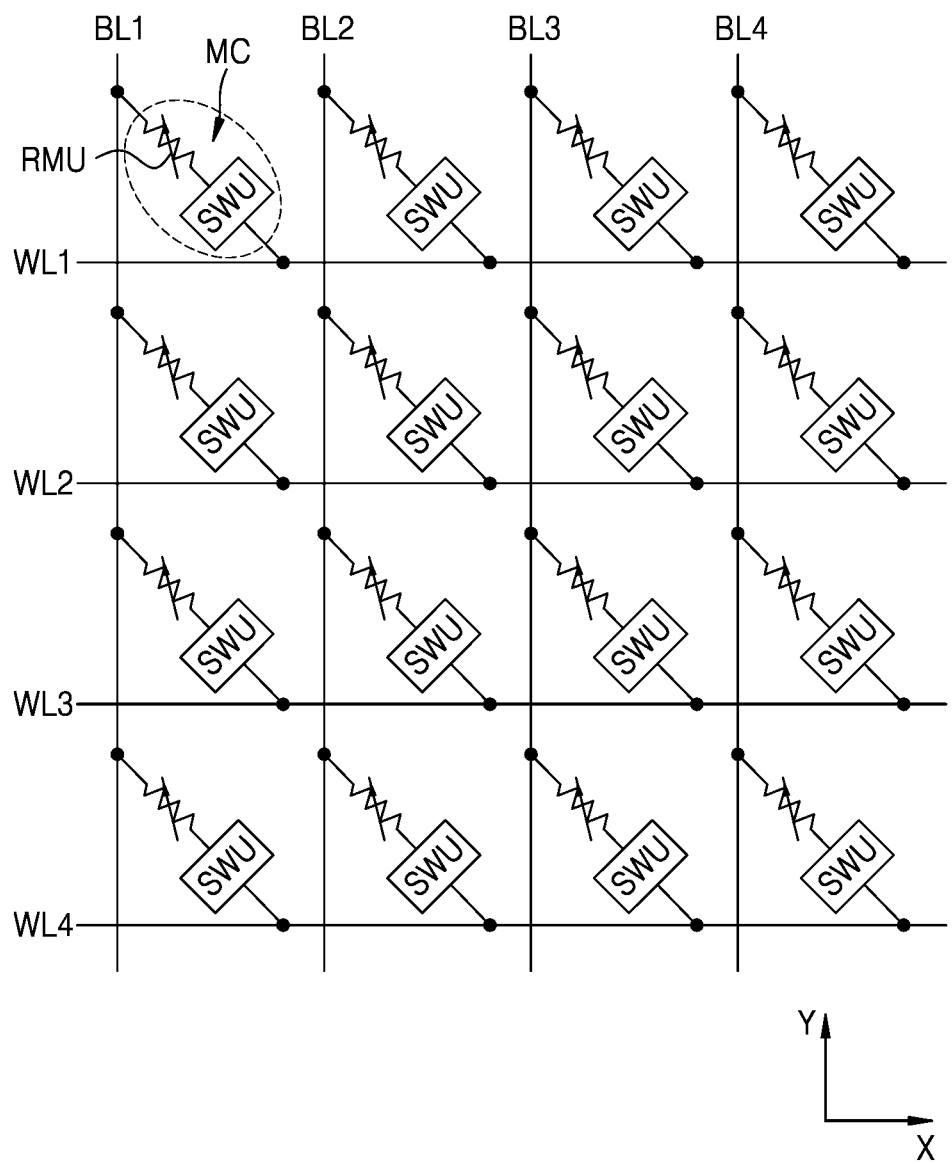
FIG. 1 is an equivalent circuit diagram of a memory device according to an example embodiment of the inventive concept.

FIG. 1 is an equivalent circuit diagram of a memory device 10 according to an example embodiment of the inventive concept.

Referring to FIG. 1, the memory device 10 may include word lines WL1, WL2, WL3, and WL4 extending in a first direction X and spaced apart from one another in a second direction Y perpendicular to the first direction X, and bit lines BL1, BL2, BL3, and BL4 extending in the second direction Y and spaced apart from one another in the first direction X.

A memory cell MC may be arranged between each of the bit lines BL1, BL2, BL3, and BL4 and each of the word lines WL1, WL2, WL3, and WL4. Specifically, the memory cell MC may be arranged at an intersection between each of the bit lines BL1, BL2, BL3, and BL4 and each of the word lines WL1, WL2, WL3, and WL4. The memory cell MC may include a variable resistance memory unit RMU and a switching unit SWU.

When one selected switching unit SWU is turned on, current may flow to the variable resistance memory unit RMU serially connected to the switching unit SWU so that data may be stored in the variable resistance memory unit RMU. For example, the current may flow to the variable resistance memory unit RMU of the memory cell MC through the word lines WL1, WL2, WL3, and WL4 and the bit lines BL1, BL2, BL3, and BL4 and the variable resistance memory unit RMU may include a phase change material layer, for example, a chalcogenide material layer that may reversibly transition between a first state and a second state. However, the variable resistance memory unit RMU is not limited thereto and may include any variable resistor of which a resistance value varies in accordance with an applied voltage. For example, in the selected memory cell MC, the resistance of the variable resistance memory unit RMU may reversibly transition between the first state and the second state in accordance with the voltage applied to the variable resistance memory unit RMU.

Using a change in resistance of the variable resistance memory unit RMU, the memory cell MC may store digital information such as '0' or '1' and may erase the digital information from the memory cell MC. For example, the data may be written in the memory cell MC in a high resistance state '0' and a low resistance state '1'. Here, writing from the high resistance state '0' to the low resistance state '1' may be referred to as 'a set operation' and writing from the low resistance state '1' to the high resistance state '0' may be referred to as 'a reset operation'. However, the memory cell MC according to an embodiment of the inventive concept does not store only the above-described digital information in the high resistance state '0' and the low resistance state '1' but also stores information in various resistance states.

An arbitrary memory cell MC may be addressed by selection of the word lines WL1, WL2, WL3, and WL4 and the bit lines BL1, BL2, BL3, and BL4, and the addressed memory cell MC may be programmed by applying a predetermined signal between the word lines WL1, WL2, WL3, and WL4 and the bit lines BL1, BL2, BL3, and BL4. In addition, by measuring a current value through the bit lines BL1, BL2, BL3, and BL4, information, that is, programmed information, in accordance with a resistance value of a variable resistance material layer of the corresponding memory cell MC may be read.

Figure 2:
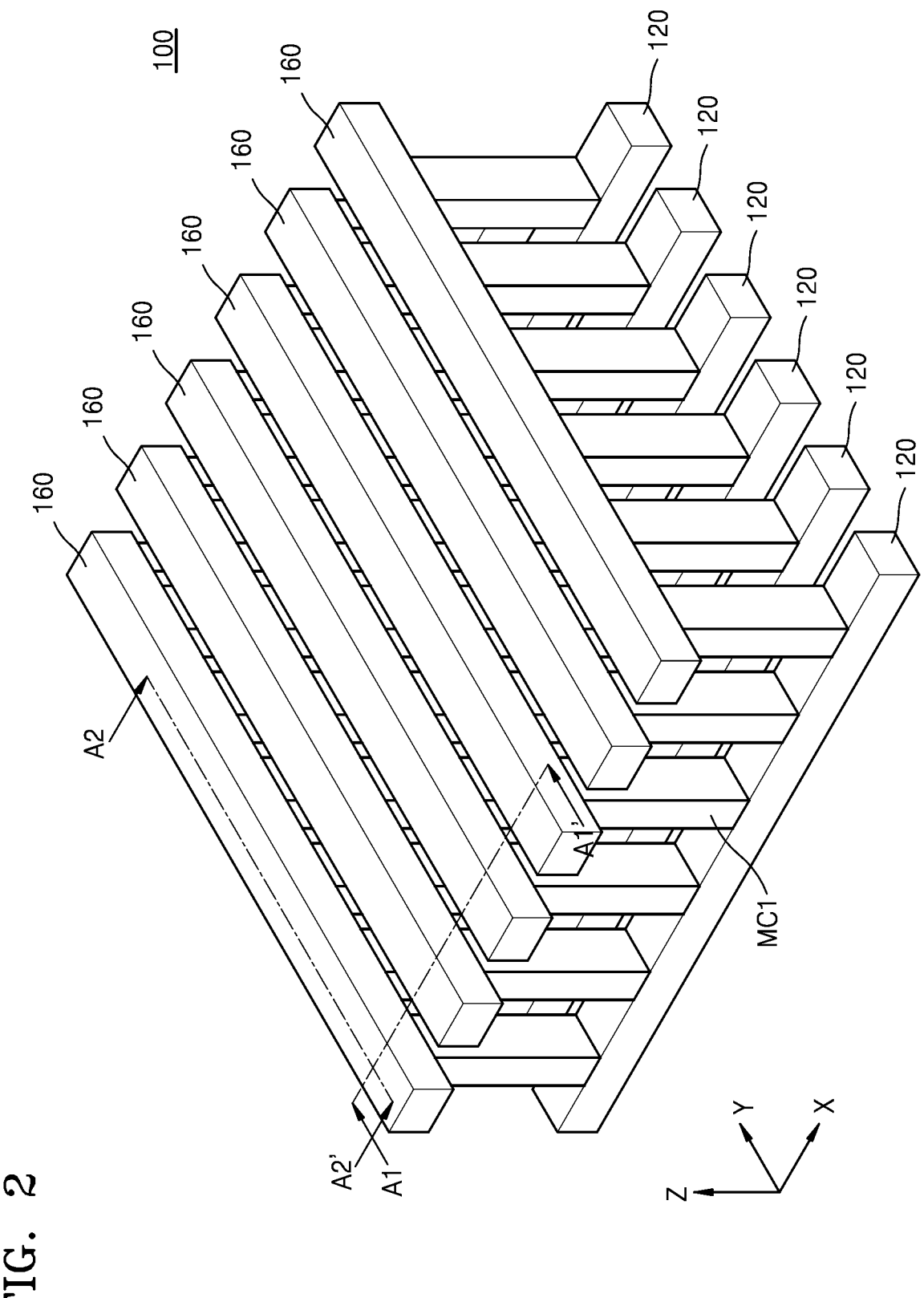
FIG. 2 is a perspective view schematically illustrating a memory device according to an example embodiment of the inventive concept.
Figure 3:
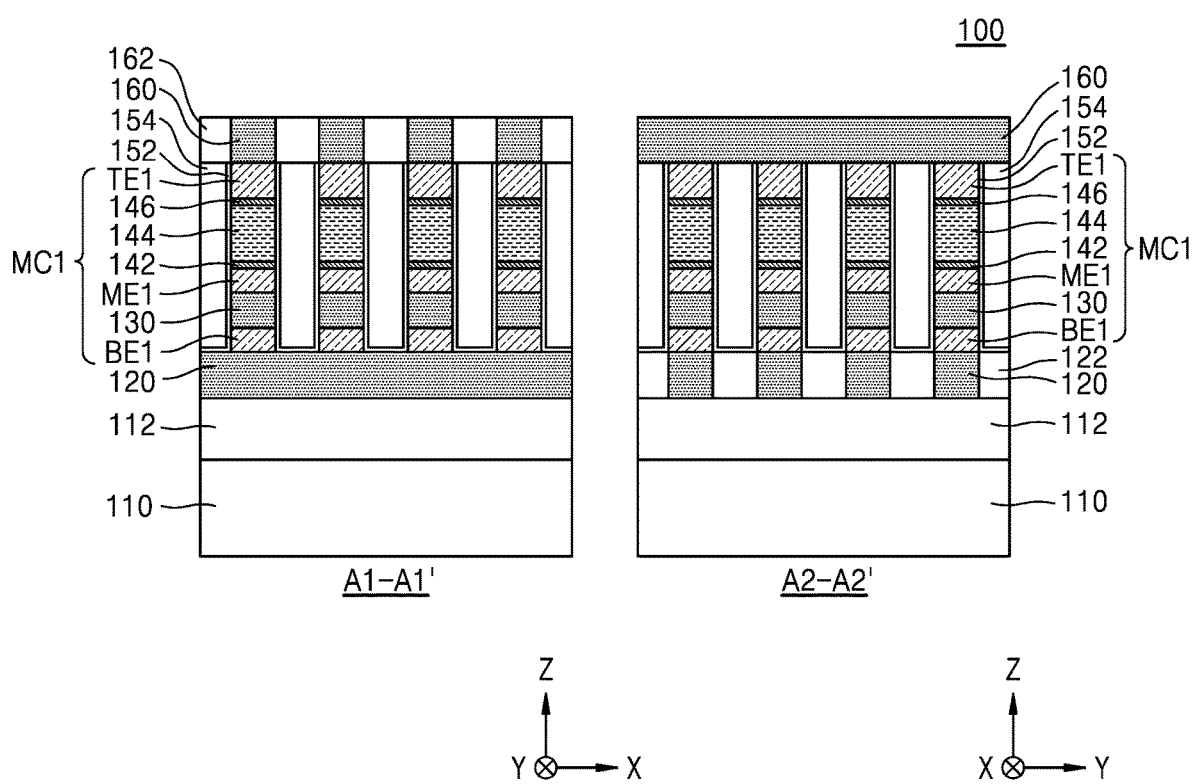
FIG. 3 is a cross-sectional view taken along the lines A1-A1' and A2-A2' of FIG. 2.
Figure 4:
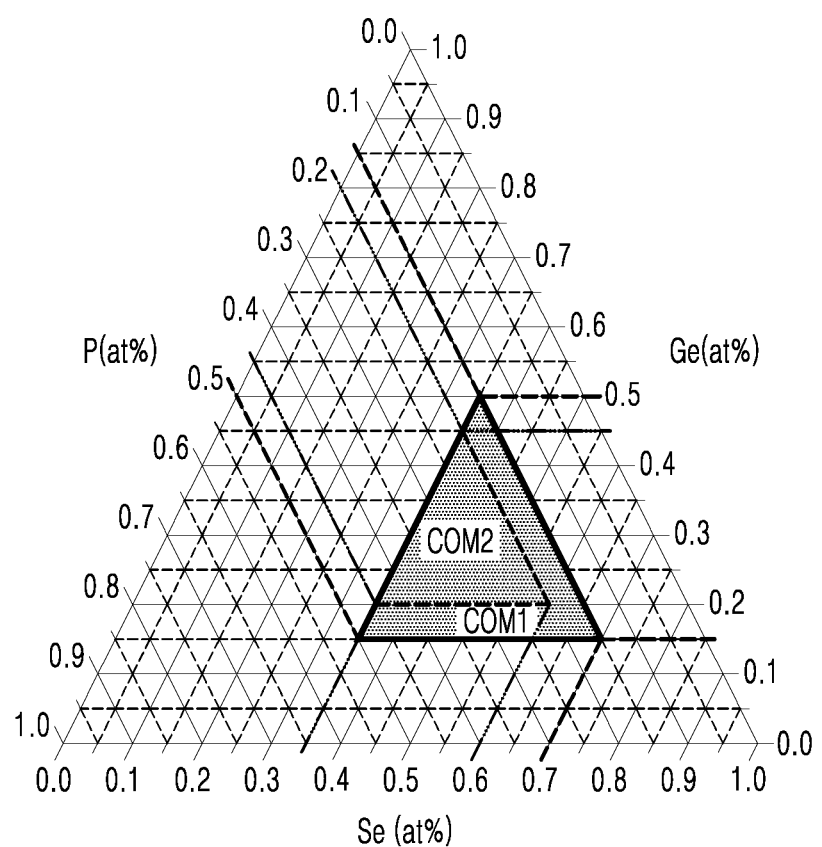
FIG. 4 illustrates a ternary composition of a chalcogenide material included in a switching element of FIG. 3.

FIG. 2 is a perspective view schematically illustrating a memory device 100 according to an example embodiment of the inventive concept. FIG. 3 is a cross-sectional view taken along the lines A1-A1' and A2-A2' of FIG. 2. FIG. 4 illustrates a ternary composition of a chalcogenide material included in the switching element 130 of FIG. 3.

Referring to FIGS. 2 to 4, the memory device 100 may include a plurality of first conductive lines 120 arranged on a substrate 110, a plurality of second conductive lines 160, and a plurality of memory cells MC1.

As illustrated in FIG. 3, a lower structure 112 may be arranged between the substrate 110 and the plurality of first conductive lines 120. The lower structure 112 may include an insulating material electrically insulating the plurality of first conductive lines 120 from the substrate 110. In some embodiments, the lower structure 112 may include a peripheral circuit TR (refer to FIG. 8) for driving the plurality of memory cells MC1 and may further include, for example, a wiring structure (not shown) for electrically connecting the peripheral circuit TR arranged on the substrate 110 to the plurality of first conductive lines 120 and the plurality of second conductive lines 160.

The plurality of first conductive lines 120 may extend in parallel in the first direction X, and the plurality of second conductive lines 160 may extend in parallel in the second direction Y intersecting with the first direction X at a vertical level higher than the plurality of first conductive lines 120. Here, the vertical level may be defined based on a top surface of the substrate 110. For example, that the plurality of second conductive lines 160 are arranged at a vertical level higher than the plurality of first conductive lines 120 may mean that a distance from each of the plurality of second conductive lines 160 to the top surface of the substrate 110 is greater than a distance from each of the plurality of first conductive lines 120 to the top surface of the substrate 110.

In terms of driving of the memory device 100, the plurality of first conductive lines 120 may, in some embodiments, correspond to the word lines WL1, WL2, WL3, and WL4 illustrated in FIG. 1 and the plurality of second conductive lines 160 may correspond to the bit lines BL1, BL2, BL3, and BL4 illustrated in FIG. 1. In other embodiments, the plurality of first conductive lines 120 may correspond to the bit lines BL1, BL2, BL3, and BL4 illustrated in FIG. 1 and the plurality of second conductive lines 160 may correspond to the word lines WL1, WL2, WL3, and WL4 illustrated in FIG. 1.

In example embodiments, each of the plurality of first conductive lines 120 and the plurality of second conductive lines 160 may include a metal, a conductive metal nitride, a conductive metal oxide, or a combination of the above materials. In some embodiments, each of the plurality of first conductive lines 120 and the plurality of second conductive lines 160 may include tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, each of the plurality of first conductive lines 120 and the plurality of second conductive lines 160 may include a metal layer and a conductive barrier layer covering at least a part of the metal layer. The conductive barrier layer may include, for example, titanium (Ti), titanium nitride (TiN), tantalum (Ta), tantalum nitride (TaN), or a combination of the above metals.

The plurality of memory cells MC1 may be arranged between the plurality of first conductive lines 120 and the plurality of second conductive lines 160 and may extend in a third direction Z perpendicular to the top surface of the substrate 110 at/to a predetermined height. For example, the plurality of first conductive lines 120 extend at a first vertical level in the first direction X, the plurality of second conductive lines 160 extend at a second vertical level that is different from the first vertical level in the second direction Y, and, in a plan view, the plurality of memory cells MC1 may be arranged at intersections or overlapping positions between the plurality of first conductive lines 120 and the plurality of second conductive lines 160. The plurality of memory cells MC1 may be arranged on the plurality of first conductive lines 120 and under the plurality of second conductive lines 160 to be spaced apart from one another in the first direction X and the second direction Y. Such an arrangement of the plurality of memory cells MC1 may be referred to as a crosspoint-type configuration. For example, the memory device 100 illustrated in FIGS. 2 to 4 may have a one-layer stack crosspoint-type configuration in which the plurality of memory cells MC1 are arranged at the same vertical level.

Each of the plurality of memory cells MC1 may include a bottom electrode BE1, a switching element 130, a middle electrode ME1, a first barrier layer 142, a variable resistance material layer 144, a second barrier layer 146, and a top electrode TE1 sequentially arranged (e.g., stacked) on each of the plurality of first conductive lines 120 in the third direction Z. For example, a bottom surface of the bottom electrode BE1 may contact a top surface of each of the plurality of first conductive lines 120 and a top surface of the top electrode TE1 may contact a bottom surface of each of the plurality of second conductive lines 160.

In example embodiments, the bottom electrode BE1, the middle electrode ME1, and the top electrode TE1 may include at least one selected from W, Ti, Ta, Al, Cu, carbon (C), CN, TiN, TiAlN, TiSiN, TiCN, TiCSiN, WN, CoSiN, WSiN, TaN, TaCN, and TaSiN. However, the inventive concept is not limited thereto.

The switching element 130 may function as a current control layer controlling flow of current and may correspond to the switching unit SWU illustrated in FIG. 1. The switching element 130 may include a material layer of which resistance may change in accordance with a magnitude of a voltage applied to both ends thereof. For example, the switching element 130 may include a chalcogenide material having an ovonic threshold switching (OTS) characteristic.

In example embodiments, the switching element 130 may include a material having a composition of $[Ge_X P_Y Se_Z]_{(1-W)}[O]_W$, (where $0.15 \leq X \leq 0.50$, $0.15 \leq Y \leq 0.50$, $0.35 \leq Z \leq 0.70$, and $0.01 \leq W \leq 0.10$). For example, the switching element 130 may include a ternary composition including germanium (Ge), phosphor (P), and selenium (Se) with a content of about 90 at % (atomic percent) to about 99 at % and may include oxygen (O) with a content of about 1 at % to about 10 at %. The ternary composition may include Ge of about 15 at % to about 50 at %, P of about 15 at % to about 50 at %, and Se of about 35 at % to about 70 at %. For example, examples of the ternary composition may include ternary compositions corresponding to various points belonging to the first composition range COM1 illustrated in FIG. 4.

In example embodiments, the switching element 130 may include a material having a composition of $[Ge_X P_Y Se_Z]_{(1-W)}[O]_W$, (where $0.20 \leq X \leq 0.45$, $0.20 \leq Y \leq 0.45$, $0.35 \leq Z \leq 0.60$, and $0.01 \leq W \leq 0.05$). For example, the switching element 130 may include a ternary composition including Ge, P, and Se with a content of about 95 at % (atomic percent) to about 99 at % and may include O with a content of about 1 at % to about 5 at %. The ternary composition may include Ge of about 20 at % to about 45 at %, P of about 20 at % to about 45 at %, and Se of about 35 at % to about 60 at %. For example, examples of the ternary composition may include ternary compositions corresponding to various points belonging to the second composition range COM2 illustrated in FIG. 4.

The switching element 130 according to example embodiments may not include arsenic (As). For example, because the chalcogenide material included in the switching element 130 does not include As, an environment may be inhibited/prevented from being contaminated and the human body may be inhibited/prevented from being adversely affected.

In addition, because the switching element 130 may include a material having a composition of $[Ge_X P_Y Se_Z]_{(1-W)}[O]_W$, (where $0.15 \leq X \leq 0.50$, $0.15 \leq Y \leq 0.50$, $0.35 \leq Z \leq 0.70$, and $0.01 \leq W \leq 0.10$) so that the switching element 130 may have remarkably low leakage current (Ioff) and remarkably low threshold voltage (Vth) drift, the switching element 130 may have fast switching performance and improved durability. The leakage current and the threshold voltage drift of the switching element 130 will be described below with reference to FIGS. 15 and 16.

In some embodiments, the variable resistance material layer 144 may include a phase change material reversibly changing between an amorphous state and a crystalline state in accordance with a heating time. For example, the variable resistance material layer 144 may include a material of which the phase may reversibly change by the Joule heat generated by a voltage applied to opposite ends thereof and of which the resistance may change by such a phase change. Specifically, the phase change material may be in a high resistance state in the amorphous state and may be in a low resistance state in the crystalline state. By defining the high resistance state as '0' and the low resistance state as '1', data may be stored in the variable resistance material layer 144.

In some embodiments, the variable resistance material layer 144 may include a single layer or a multilayer including a material selected from binary materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, ternary materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, quaternary materials such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and quinary materials such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In other example embodiments, the variable resistance material layer 144 may include a material selected from the above binary materials to quinary materials and at least one element selected from boron (B), C, nitrogen (N), O, P, cadmium (Cd), W, Ti, hafnium (Hf), and zirconium (Zr).

The variable resistance material layer 144 may be implemented as a phase change material. However, the inventive concept is not limited thereto, and the variable resistance material layer 144 may include one of various materials having a resistance change characteristic.

In some embodiments, when the variable resistance material layer 144 includes a transition metal oxide, the memory device 100 may be a resistive random access memory (ReRAM). At least one electrical path may be generated or extinguished in the variable resistance material layer 144 including a transition metal oxide by a programming operation. The variable resistance material layer 144 may have low resistance when the electrical path is generated and may have high resistance when the electrical path is extinguished. Data may be stored in the memory device 100 by using a difference in resistance of the variable resistance material layer 144.

When the variable resistance material layer 144 includes a transition metal oxide, the transition metal oxide may include at least one metal selected from Ta, Zr, Ti, Hf, manganese (Mn), yttrium (Y), Ni, Co, Zn, niobium (Nb), Cu, iron (Fe), and Cr. For example, the transition metal oxide may include a single layer or a multilayer including at least one material selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above materials, x and y may be respectively in the ranges of $0 \leq x \leq 1.5$ and $0 \leq y \leq 0.5$. However, the inventive concept is not limited thereto.

In other embodiments, when the variable resistance material layer 144 has a magnetic tunnel junction (MTJ) structure including two magnetic electrodes and a dielectric material between the two magnetic electrodes, the memory device 100 may be a magnetic RAM (MRAM).

The two magnetic electrodes may include a fixed magnetization layer and a free magnetization layer, and the dielectric material between the two magnetic electrodes may be a tunnel barrier layer. The fixed magnetization layer may have a magnetization direction fixed in one direction, and the free magnetization layer may have a magnetization direction that may change to be parallel or antiparallel with the magnetization direction of the fixed magnetization layer. The magnetization directions of the fixed magnetization layer and the free magnetization layer may be parallel with one surface of the tunnel barrier layer. However, the inventive concept is not limited thereto. The magnetization directions of the fixed magnetization layer and the free magnetization layer may be perpendicular to one (e.g., a primary) surface of the tunnel barrier layer.

When the magnetization direction of the free magnetization layer is parallel with the magnetization direction of the fixed magnetization layer, the variable resistance material layer 144 may have a first resistance value. On the other hand, when the magnetization direction of the free magnetization layer is antiparallel with the magnetization direction of the fixed magnetization layer, the variable resistance material layer 144 may have a second resistance value. Data may be stored in the memory device 100 by using such a difference in resistance of the variable resistance material layer 144. The magnetization direction of the free magnetization layer may change by spin torque of electrons in programming current.

The fixed magnetization layer and the free magnetization layer may include a magnetic material. At this time, the fixed magnetization layer may further include an antiferromagnetic material fixing the magnetization direction of a ferromagnetic material therein. The tunnel barrier layer may include oxide of one material selected from magnesium (Mg), Ti, Al, MgZn, and MgB. However, the inventive concept is not limited thereto.

The first barrier layer 142 may be arranged between the variable resistance material layer 144 and the middle electrode ME1, and the second barrier layer 146 may be arranged between the variable resistance material layer 144 and the top electrode TE1. The first barrier layer 142 and the second barrier layer 146 may include WN, WC, or a combination of the above materials. However, the inventive concept is not limited thereto.

In FIGS. 2 and 3, each of the plurality of memory cells MC1 is illustrated having a square columnar shape. However, a shape of each of the plurality of memory cells MC1 is not limited thereto. For example, each of the plurality of memory cells MC1 may have cylindrical, elliptical columnar, or polygonal columnar shapes. In addition, in FIGS. 2 and 3, an upper width of each of the plurality of memory cells MC1 is illustrated as being equal to a lower width of each of the plurality of memory cells MC1. However, a lower width of at least some of the plurality of memory cells MC1 may be greater than an upper width of at least some of the plurality of memory cells MC1. For example, a lower width (for example, a width of a bottom surface) of the variable resistance material layer 144 may be greater than an upper width (for example, a width of a top surface) of the variable resistance material layer 144. In addition, a lower width (for example, a width of a bottom surface) of the switching element 130 may be greater than an upper width (for example, a width of a top surface) of the switching element 130.

A first insulating layer 122 in (e.g., filling) spaces between the plurality of first conductive lines 120 may be arranged on the lower structure 112. Side walls of each of the plurality of memory cells MC1 may be covered with insulation liners 152. The insulation liners 152 may be conformally arranged on the side walls of each of the plurality of memory cells MC1, and an insulation buried layer 154 may be in (e.g., may fill) spaces between the plurality of memory cells MC1 on the insulation liners 152. A second insulating layer 162 in (e.g., filling) spaces between the plurality of second conductive lines 160 may be arranged on the insulation buried layer 154.

In example embodiments, the first insulating layer 122, the insulation liners 152, the insulation buried layer 154, and the second insulating layer 162 may include silicon oxide, silicon nitride, or a combination of silicon oxide and silicon nitride. In some embodiments, air gaps (not shown) or voids may be formed in the insulation buried layer 154. In other embodiments, air gaps or voids may be formed in the second insulating layer 162.

Hereinafter, performance characteristics of memory devices including switching elements according to example embodiments will be described in detail with reference to FIGS. 15 and 16.

Figure 15:
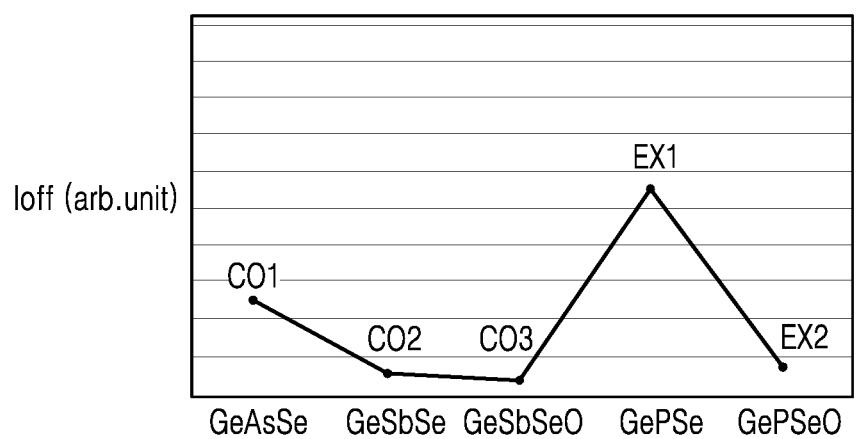
FIG. 15 is a graph schematically illustrating leakage current of a switching element according to an example embodiment of the inventive concept.
Figure 16:
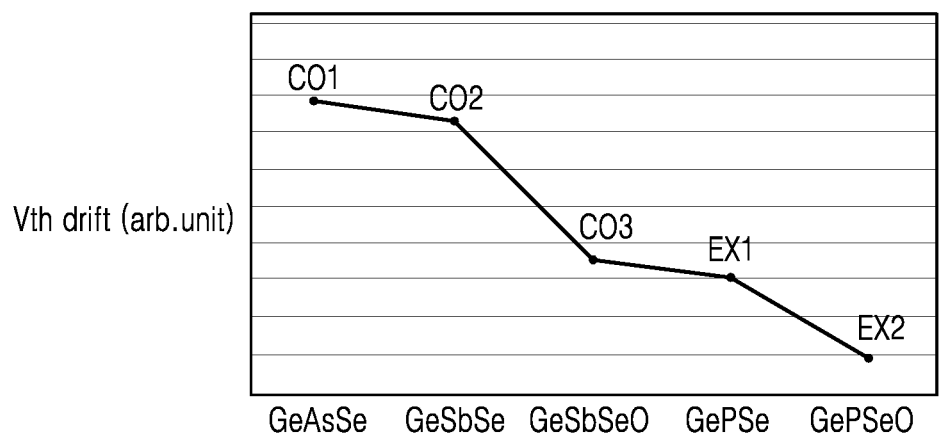
FIG. 16 is a graph schematically illustrating threshold voltage drift of a switching element according to an example embodiment of the inventive concept.

FIG. 15 is a graph schematically illustrating leakage current of a switching element (e.g., a switching element 130) according to an example embodiment of the inventive concept, and FIG. 16 is a graph schematically illustrating threshold voltage drift of a switching element according to an example embodiment of the inventive concept.

Comparative examples 1 to 3 CO1, CO2, and CO3 and Embodiments 1 and 2 EX1 and EX2 include a chalcogenide material having a composition in accordance with the following table 1.

TABLE 1

| kind | composition |
| --- | --- |
| Comparative example 1 CO1 | $Ge_{0.20}As_{0.20}Se_{0.60}$ |
| Comparative example 2 CO2 | $Ge_{0.20}Sb_{0.20}Se_{0.60}$ |
| Comparative example 3 CO3 | $[Ge_{0.20}Sb_{0.20}Se_{0.60}]_{0.90}O_{0.10}$ |
| Embodiment 1 EX1 | $Ge_{0.30}P_{0.25}Se_{0.45}$ |
| Embodiment 2 EX2 | $[Ge_{0.30}P_{0.25}Se_{0.45}]_{0.95}O_{0.05}$ |

As illustrated in FIG. 15, Embodiment 1 EX1 represents a leakage current (Ioff) slightly higher than that of Comparative example 1 CO1. However, Embodiment 2 EX2 represents a leakage current (Ioff) remarkably reduced from that of Comparative example 1 CO1 by about 71%.

As illustrated in FIG. 16, Embodiment 1 EX1 represents threshold voltage (Vth) drift reduced from that of Comparative example 1 CO1 by about 62% and Embodiment 2 EX2 represents threshold voltage (Vth) drift reduced from that of Comparative example 1 CO1 by about 90%.

For example, in comparison with Comparative example 1 CO1 including a ternary composition of Ge, As, and Se, in Embodiment 1 EX1 including the ternary composition of Ge, P, and Se, it may be assumed that structural stability may increase due to strong bonding between P and Ge and between P and Se so that threshold voltage (Vth) drift, which represents a change in threshold voltage (Vth) due to repeated use, may be reduced or mitigated.

Nevertheless, in Embodiment 1 EX1 including the ternary composition of Ge, P, and Se, due to generation of a trap site with more P than As, it is observed that the leakage current (Ioff) increases.

Embodiment 2 EX2 obtained by adding O to the ternary composition of Ge, P, and Se exhibits leakage current (Ioff) reduced from that of Comparative example 1 CO1 and Embodiment 1 EX1 and threshold voltage (Vth) drift reduced from that of Comparative example 1 CO1 and Embodiment 1 EX1. It may be assumed that added O may increase structural stability by strong bonding with Ge and P and may passivate a trap site caused by dangling bonds in Ge—P bonding so that the reduced leakage current (Ioff) and the reduced threshold voltage (Vth) drift are obtained.

For reference, Comparative example 2 CO2 including a ternary composition of Ge, antimony (Sb), and Se and Comparative example 3 CO3 obtained by adding O to the ternary composition of Ge, Sb, and Se are illustrated together in FIGS. 15 and 16. Both Comparative example 2 CO2 and Comparative example 3 CO3 exhibit leakage current (Ioff) reduced from that of Comparative example 1 CO1. Nevertheless, Comparative example 2 CO2 and Comparative example 3 CO3 exhibit relatively high threshold voltage (Vth) drift and Embodiment 2 EX2 according to the inventive concept represents threshold voltage (Vth) drift remarkably reduced from that of Comparative example 2 CO2 by about 89% and from that of Comparative example 3 CO3 by about 77%.

Referring to FIGS. 2 to 4, the memory device 100 according to example embodiments includes the switching element 130 including a material having a composition of $[Ge_XP_YSe_Z]_{(1-W)}[O]_W$, (where $0.15 \leq X \leq 0.50$, $0.15 \leq Y \leq 0.50$, $0.35 \leq Z \leq 0.70$, and $0.01 \leq W \leq 0.10$). Because the switching element 130 does not include As, an environment may be inhibited/prevented from being contaminated and the human body may be inhibited/prevented from being adversely affected. Furthermore, leakage current (Ioff) and threshold voltage (Vth) drift remarkably less than those of a case in which the switching element 130 includes As may be obtained. Therefore, the switching element 130 may have fast switching performance and improved durability.

Figure 5:
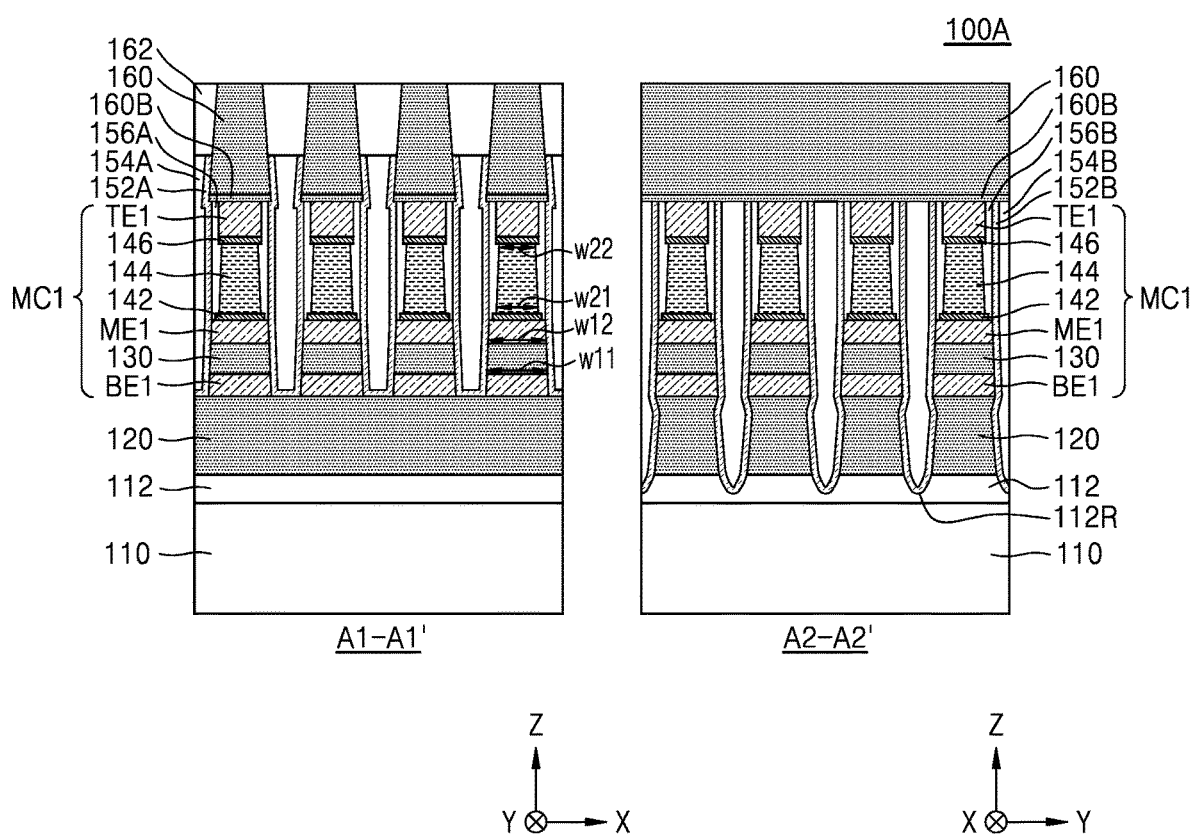
FIG. 5 is a cross-sectional view illustrating a memory device according to an example embodiment of the inventive concept.

FIG. 5 is a cross-sectional view illustrating a memory device 100A according to an example embodiment of the inventive concept. In FIG. 5, reference numerals the same as those of FIGS. 1 to 4 denote the same components.

Referring to FIG. 5, side walls of each of the plurality of memory cells MC1 in the first direction X may be covered with first insulation liners 152A and a first insulation buried layer 154A and side walls of each of the plurality of memory cells MC1 in the second direction Y may be covered with second insulation liners 152B and a second insulation buried layer 154B. In addition, first spacers 156A may be interposed between the side walls of each of the plurality of memory cells MC1 in the first direction X and the first insulation liners 152A so that, for example, side walls of the top electrode TE1 and the variable resistance material layer 144 may be covered with the first spacers 156A. In addition, second spacers 156B may be interposed between the side walls of each of the plurality of memory cells MC1 in the second direction Y and the second insulation liners 152B so that, for example, the side walls of the top electrode TE1 and the variable resistance material layer 144 may be covered with the second spacers 156B.

In example embodiments, the first and second spacers 156A and 156B may include a material having etch selectivity with respect to the first and second insulation liners 152A and 152B. In some examples, the first and second spacers 156A and 156B may include silicon oxide and the first and second insulation liners 152A and 152B may include silicon nitride.

As illustrated in FIG. 5, the first insulation liners 152A and the first insulation buried layer 154A may further extend on side walls of each of the plurality of second conductive lines 160 and may have top surfaces at a level higher than that of bottom surfaces of the plurality of second conductive lines 160. For example, lower portions of the side walls of each of the plurality of second conductive lines 160 in the first direction X may be covered with the first insulation liners 152A and upper portions of the side walls of each of the plurality of second conductive lines 160 in the first direction X may be covered with the second insulating layer 162.

In addition, the second insulation liners 152B and the second insulation buried layer 154B may further extend on side walls of each of the plurality of first conductive lines 120 and may have bottom surfaces at a level lower than that of bottom surfaces of the plurality of first conductive lines 120. For example, as illustrated in FIG. 5, recesses 112R are formed on a top surface of the lower structure 112 and side walls of each of the plurality of first conductive lines 120 in the second direction Y and internal walls of the recesses 112R may be covered with the second insulation liners 152B. Accordingly, the second insulation liners 152B may extend into the recesses 112R.

In example embodiments, the plurality of memory cells MC1 may be formed by sequentially performing a first patterning process and a second patterning process on a memory cell stack MCS (refer to FIG. 11) by using a line type etching mask. For example, a first mask pattern (not shown) extending in the first direction X may be formed on the memory cell stack MCS and the top electrode TE1, the second barrier layer 146, the variable resistance material layer 144, and the first barrier layer 142 may be patterned by using the first mask pattern as an etching mask. Then, second spacers 156B may be formed on opposing side walls of the top electrode TE1, the second barrier layer 146, the variable resistance material layer 144, and the first barrier layer 142 arranged in the second direction Y. Then, the middle electrode ME1, the switching element 130, the bottom electrode BE1, and the plurality of first conductive lines 120 may be patterned by using the first mask pattern as the etching mask, and the second insulation liners 152B and the second insulation buried layer 154B may be formed on side walls of the memory cell stack MCS in the second direction Y. Then, a second mask pattern (not shown) extending in the second direction Y may be formed on the memory cell stack MCS, and the top electrode TE1, the second barrier layer 146, the variable resistance material layer 144, and the first barrier layer 142 may be patterned by using the second mask pattern as an etching mask. Then, first spacers 156A may be formed on opposing side walls of the top electrode TE1, the second barrier layer 146, the variable resistance material layer 144, and the first barrier layer 142 arranged in the first direction X and extending in the second direction Y. Then, each of the plurality of memory cells MC1 may be formed by patterning the middle electrode ME1, the switching element 130, and the bottom electrode BE1 by using the second mask pattern as the etching mask, and the first insulation liners 152A and the first insulation buried layer 154A may be formed on the side walls of each of the plurality of memory cells MC1 in the first direction X.

In example embodiments, each of the switching element 130 and the variable resistance material layer 144 may have inclined side walls and may have a width reduced toward an upper portion. A bottom surface of the switching element 130 may have a first width w11 in the first direction X and a top surface thereof may have a second width w12 less than the first width w11 in the first direction X. A bottom surface of the variable resistance material layer 144 may have a third width w21 in the first direction X and a top surface thereof may have a fourth width w22 less than the third width w21 in the first direction X.

Selectively, a barrier layer 160B may be arranged between each of the plurality of second conductive lines 160 and the top electrode TE1. However, the inventive concept is not limited thereto.

Figure 6:
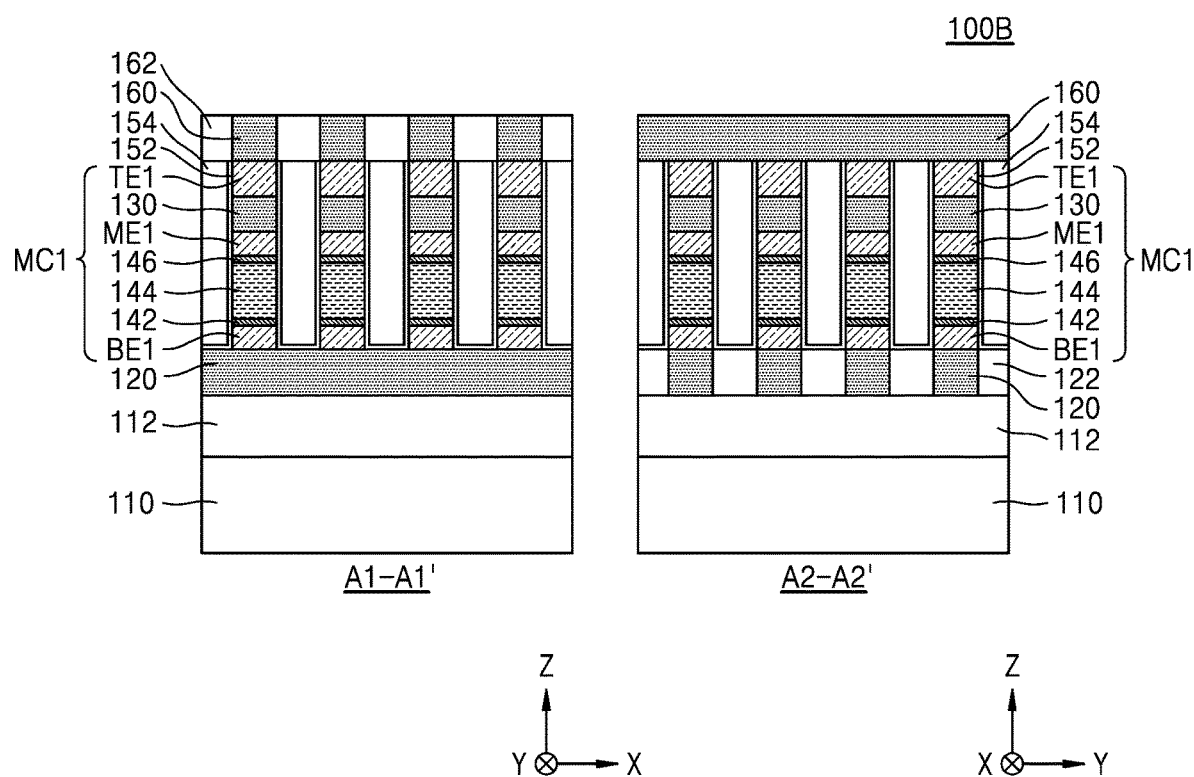
FIG. 6 is a cross-sectional view illustrating a memory device according to an example embodiment of the inventive concept.

FIG. 6 is a cross-sectional view illustrating a memory device 100B according to an example embodiment of the inventive concept. In FIG. 6, reference numerals the same as those of FIGS. 1 to 5 denote the same components.

Referring to FIG. 6, each of the plurality of memory cells MC1 may include the bottom electrode BE1, the first barrier layer 142, the variable resistance material layer 144, the second barrier layer 146, the middle electrode ME1, the switching element 130, and the top electrode TE1 sequentially arranged on each of the plurality of first conductive lines 120. That is, the variable resistance material layer 144 may be arranged at a vertical level lower than that of the switching element 130.

Figure 7:
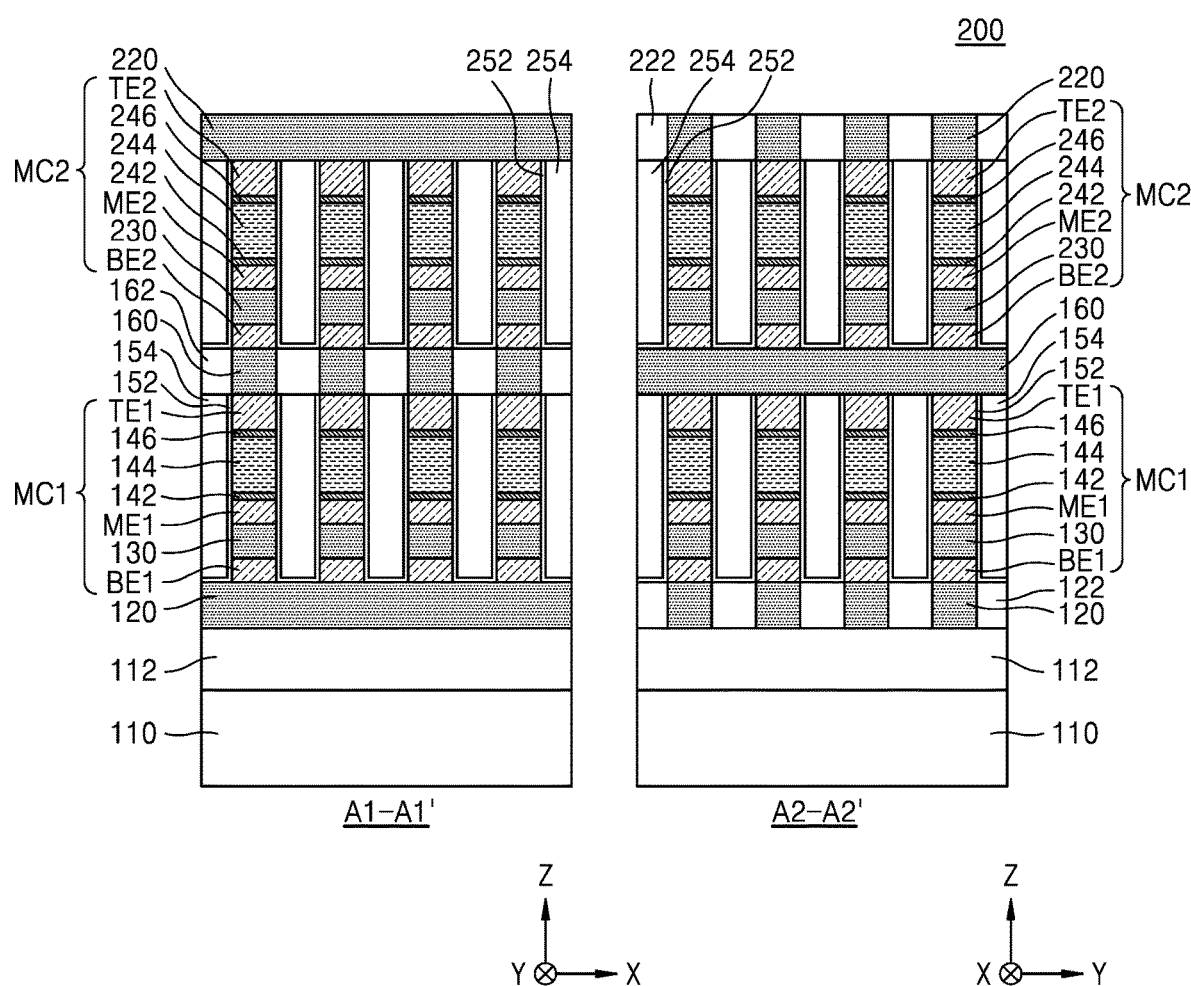
FIG. 7 is a cross-sectional view illustrating a memory device according to an example embodiment of the inventive concept.

FIG. 7 is a cross-sectional view illustrating a memory device 200 according to an example embodiment of the inventive concept. In FIG. 7, reference numerals the same as those of FIGS. 1 to 6 denote the same components.

Referring to FIG. 7, the memory device 200 may have a two-layer stack crosspoint-type configuration in which a plurality of first memory cells MC1 are arranged at a first vertical level and a plurality of second memory cells MC2 are arranged at a second vertical level different from the first vertical level.

For example, the plurality of first conductive lines 120 may extend in the first direction X, the plurality of second conductive lines 160 may extend in the second direction Y, and the plurality of first memory cells MC1 may be arranged between the plurality of first conductive lines 120 and the plurality of second conductive lines 160. A plurality of third conductive lines 220 may extend in the first direction X, and the plurality of second memory cells MC2 may be arranged between the plurality of second conductive lines 160 and the plurality of third conductive lines 220.

For example, the plurality of first conductive lines 120 and the plurality of third conductive lines 220 may correspond to a plurality of first word lines and a plurality of second word lines, and the plurality of second conductive lines 160 may correspond to a plurality of common bit lines. Here, the term "common bit lines" may mean that the plurality of second conductive lines 160 may function as bit lines applying electrical signals for the plurality of first memory cells MC1 and bit lines applying electrical signals for the plurality of second memory cells MC2.

Each of the plurality of first memory cells MC1 may include the first bottom electrode BE1, the first switching element 130, the first middle electrode ME1, the first barrier layer 142, the first variable resistance material layer 144, the second barrier layer 146, and the first top electrode TE1 sequentially arranged on each of the plurality of first conductive lines 120 in the third direction Z. Each of the plurality of second memory cells MC2 may include a second bottom electrode BE2, a second switching element 230, a second middle electrode ME2, a third barrier layer 242, a second variable resistance material layer 244, a fourth barrier layer 246, and a second top electrode TE2 sequentially arranged on each of the plurality of second conductive lines 160 in the third direction Z.

Side walls of each of the plurality of first memory cells MC1 may be covered with first insulation liners 152 and a first insulation buried layer 154 may be in (e.g., may fill) spaces between the plurality of first memory cells MC1 on the first insulation liners 152. Side walls of each of the plurality of second memory cells MC2 may be covered with second insulation liners 252 and a second insulation buried layer 254 may be in (e.g., may fill) spaces between the plurality of second memory cells MC2 on the second insulation liners 252. A third insulating layer 222 in (e.g., filling) spaces between the plurality of third conductive lines 220 may be arranged on the second insulation buried layer 254.

Figure 8:
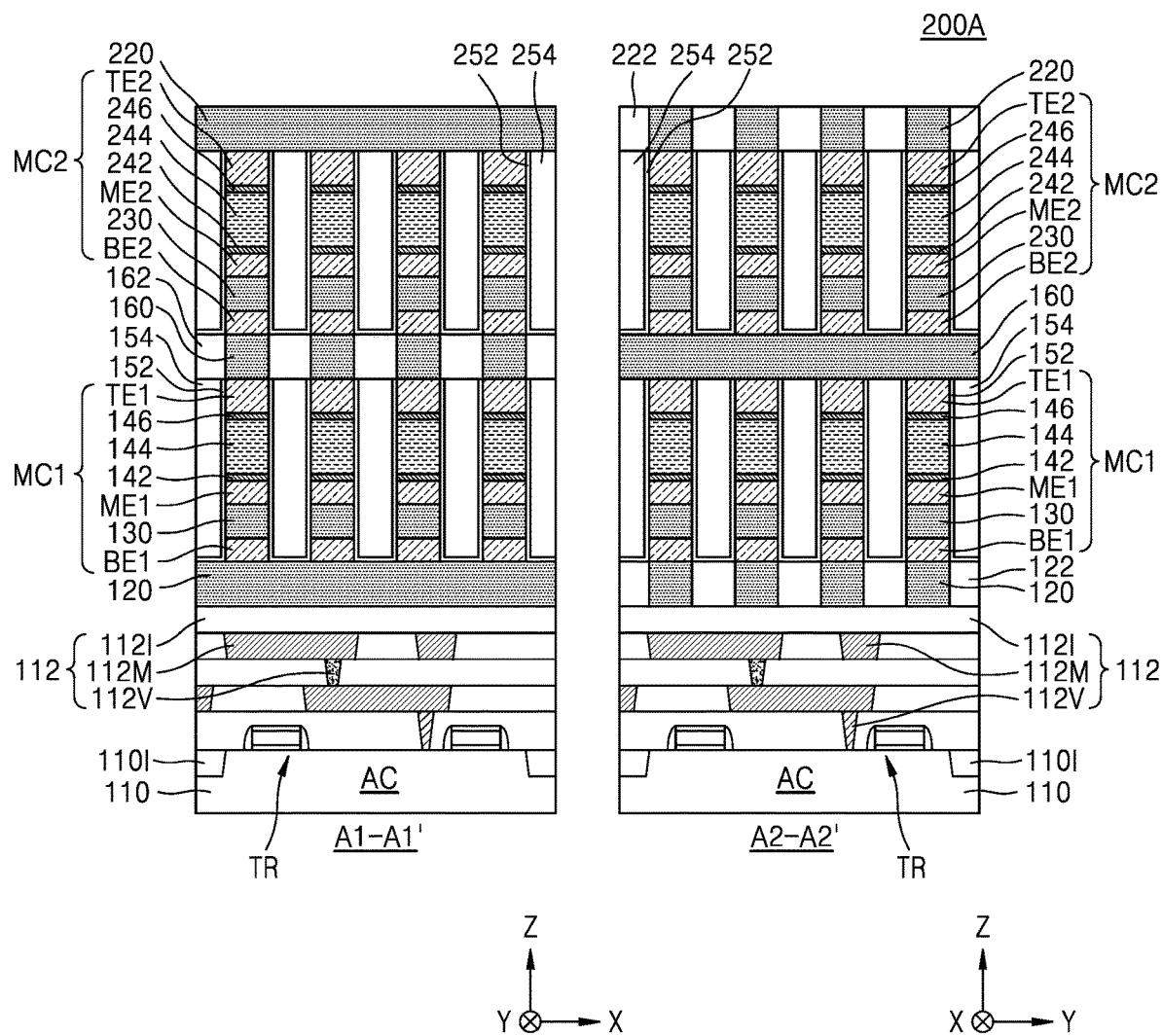
FIG. 8 is a cross-sectional view illustrating a memory device according to an example embodiment of the inventive concept.

FIG. 8 is a cross-sectional view illustrating a memory device 200A according to an example embodiment of the inventive concept. In FIG. 8, reference numerals the same as those of FIGS. 1 to 7 denote the same components.

Referring to FIG. 8, the memory device 200A may have a two-layer stack crosspoint-type configuration including a peripheral circuit TR arranged on a substrate 110 and a plurality of first and second memory cells MC1 and MC2 arranged at a vertical level higher than that of the peripheral circuit TR.

An isolation layer 110I defining an active area AC may be arranged on the substrate 110, and the peripheral circuit TR may be arranged on the active area AC. The peripheral circuit TR may include a page buffer, a latch circuit, a cache circuit, a column decoder, a sense amplifier, a data in/out circuit, or a row decoder. The peripheral circuit TR may be electrically connected to the plurality of first to third conductive lines 120, 160, and 220 in order to drive the plurality of first and second memory cells MC1 and MC2.

In example embodiments, the lower structure 112 may include a conductive via 112V, a wiring layer 112M, and an interlayer insulating layer 112I. The conductive via 112V may be electrically connected to the active area AC and/or the peripheral circuit TR, the wiring layer 112M may be connected to the conductive via 112V, and the interlayer insulating layer 112I may cover the peripheral circuit TR, the wiring layer 112M, and the conductive via 112V.

The wiring layer 112M and the conductive via 112V may include a conductive material such as W, molybdenum (Mo), Ti, Co, Ta, Ni, W silicide, titanium silicide, cobalt silicide, tantalum silicide, or nickel silicide. The interlayer insulating layer 112I may include silicon oxide or a low-k dielectric insulating material.

The plurality of first conductive lines 120, the plurality of second conductive lines 160, the plurality of third conductive lines 220, the plurality of first memory cells MC1, and the plurality of second memory cells MC2 may be arranged on the lower structure 112. Although not shown, a cell contact (not shown) connecting each of the plurality of first conductive lines 120, the plurality of second conductive lines 160, and the plurality of third conductive lines 220 to the wiring layer 112M may be further arranged.

Here, FIG. 8 illustrates an example of a common bit line structure in which the plurality of first memory cells MC1 are arranged under the plurality of second conductive lines 160 and the plurality of second memory cells MC2 are arranged on the plurality of second conductive lines 160. However, in other embodiments, instead of the common bit line structure, a first bit line and a second bit line physically and electrically isolated from each other may be used. For example, a first word line extending in the first direction X, a first bit line extending in the second direction Y, the plurality of first memory cells MC1 arranged between the first word line and the first bit line, a second word line extending at a vertical level higher than that of the first bit line in the first direction X, a second bit line extending in the second direction Y, and the plurality of second memory cells MC2 arranged between the second word line and the second bit line may be arranged.

Figure 9:
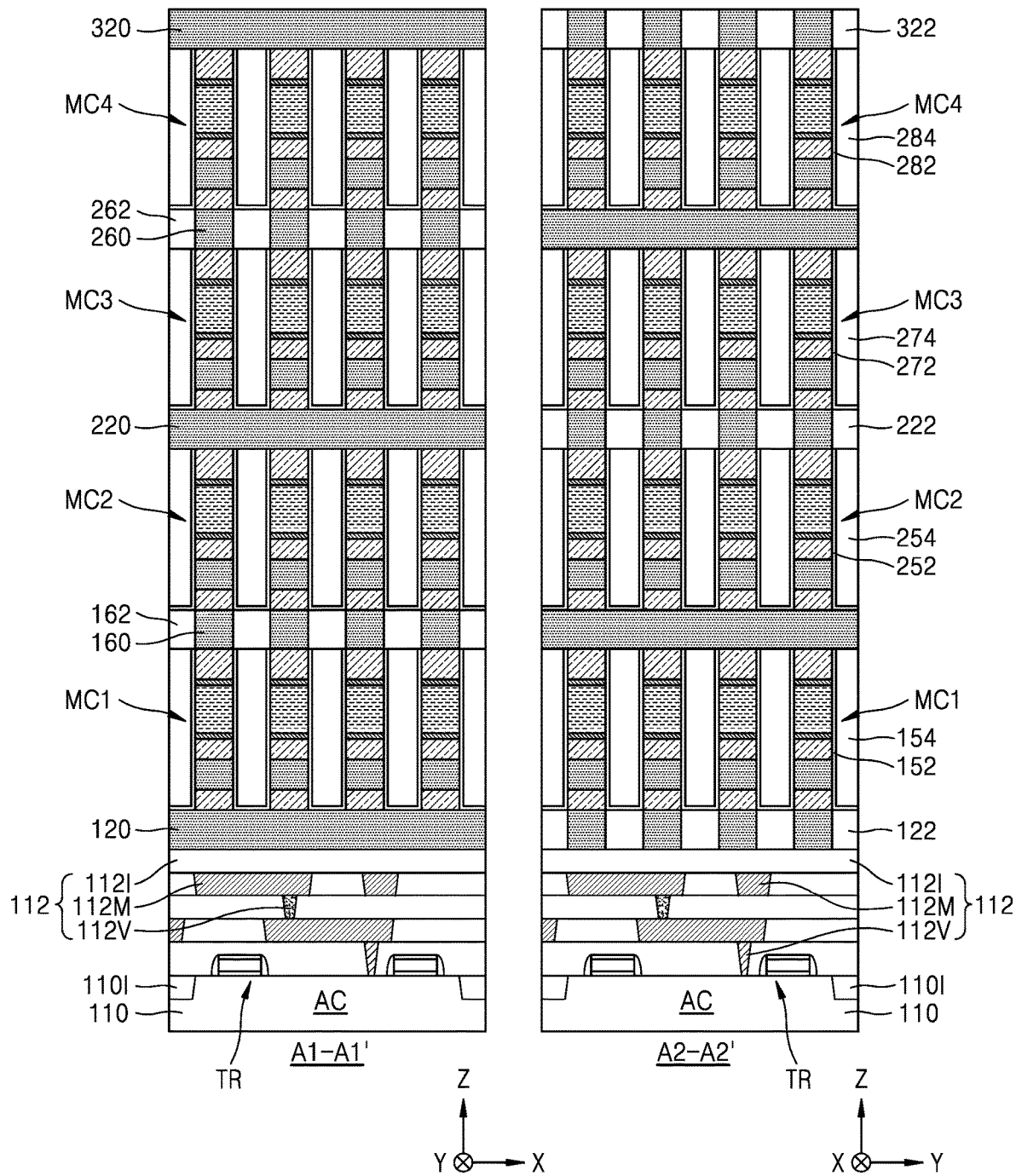
FIG. 9 is a cross-sectional view illustrating a memory device according to an example embodiment of the inventive concept.

FIG. 9 is a cross-sectional view illustrating a memory device 300 according to an example embodiment of the inventive concept. In FIG. 9, reference numerals the same as those of FIGS. 1 to 8 denote the same components.

Referring to FIG. 9, the memory device 300 may have a four-layer stack crosspoint-type configuration including a peripheral circuit TR arranged on a substrate 110 and a plurality of first to fourth memory cells MC1, MC2, MC3, and MC4 arranged at a vertical level higher than that of the peripheral circuit TR.

For example, the plurality of first conductive lines 120 may extend in the first direction X, the plurality of second conductive lines 160 may extend in the second direction Y, and the plurality of first memory cells MC1 may be arranged between the plurality of first conductive lines 120 and the plurality of second conductive lines 160. A plurality of third conductive lines 220 may extend in the first direction X, and the plurality of second memory cells MC2 may be arranged between the plurality of second conductive lines 160 and the plurality of third conductive lines 220. A plurality of fourth conductive lines 260 may extend in the second direction Y, and the plurality of third memory cells MC3 may be arranged between the plurality of third conductive lines 220 and the plurality of fourth conductive lines 260. A plurality of fifth conductive lines 320 may extend in the first direction X, and the plurality of fourth memory cells MC4 may be arranged between the plurality of fourth conductive lines 260 and the plurality of fifth conductive lines 320.

For example, the plurality of first, third, and fifth conductive lines 120, 220, and 320 may correspond to a plurality of first to third word lines and the plurality of second and fourth conductive lines 160 and 260 may correspond to a plurality of first and second bit lines. The plurality of second conductive lines 160 may function as common bit lines for the plurality of first memory cells MC1 and the plurality of second memory cells MC2, the plurality of third conductive lines 220 may function as common word lines for the plurality of second memory cells MC2 and the plurality of third memory cells MC3, and the plurality of fourth conductive lines 260 may function as common bit lines for the plurality of third memory cells MC3 and the plurality of fourth memory cells MC4.

The first insulating layer 122 may be in (e.g., may fill) the spaces between the plurality of first conductive lines 120, the second insulating layer 162 may be in (e.g., may fill) the spaces between the plurality of second conductive lines 160, the third insulating layer 222 may be in (e.g., may fill) the spaces between the plurality of third conductive lines 220, the fourth insulating layer 262 may be in (e.g., may fill) the spaces between the plurality of fourth conductive lines 260, and a fifth insulating layer 322 may be in (e.g., may fill) spaces between the plurality of fifth conductive lines 320.

Side walls of each of the plurality of first memory cells MC1 may be covered with first insulation liners 152 and a first insulation buried layer 154 may be in (e.g., may fill) spaces between the plurality of first memory cells MC1 on the first insulation liners 152. Side walls of each of the plurality of second memory cells MC2 may be covered with second insulation liners 252, and a second insulation buried layer 254 may be in (e.g., may fill) spaces between the plurality of second memory cells MC2 on the second insulation liners 252. Side walls of each of the plurality of third memory cells MC3 may be covered with third insulation liners 272, and a third insulation buried layer 274 may be in (e.g., may fill) spaces between the plurality of third memory cells MC3 on the third insulation liners 272. Side walls of each of the plurality of fourth memory cells MC4 may be covered with fourth insulation liners 282, and a fourth insulation buried layer 284 may be in (e.g., may fill) spaces between the plurality of fourth memory cells MC4 on the fourth insulation liners 282.

FIGS. 10 to 14 are cross-sectional views illustrating manufacturing processes of a memory device 100 according to an example embodiment of the inventive concept.

Figure 10:
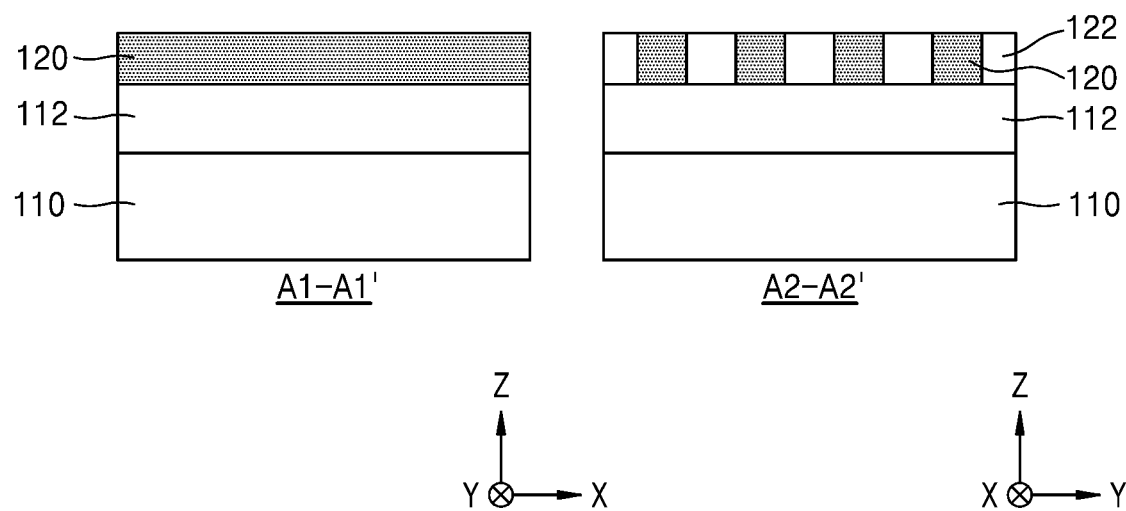
FIGS. 10 to 14 are cross-sectional views illustrating manufacturing processes of a memory device according to an example embodiment of the inventive concept.

Referring to FIG. 10, the lower structure 112 may be formed on the substrate 110. For example, as illustrated in FIG. 8, the lower structure 112 may be formed by repeatedly performing forming the peripheral circuit TR on the substrate 110, forming the interlayer insulating layer 112I covering the peripheral circuit TR, forming the conductive via 112V passing through the interlayer insulating layer 112I, forming the wiring layer 112M connected to the conductive via 112V, and forming the interlayer insulating layer 112I covering the wiring layer 112M.

The plurality of first conductive lines 120 and the first insulating layer 122 in (e.g., filling) the spaces between the plurality of first conductive lines 120 may be formed on the lower structure 112. In example embodiments, the plurality of first conductive lines 120 may be formed by forming a conductive material layer (not shown) first, forming mask patterns (not shown) on the conductive material layer, and patterning the conductive material layer by using the mask patterns as etching masks. Then, the first insulating layer 122 may be formed by forming an insulating material layer (not shown) at least partially filling the spaces between the plurality of first conductive lines 120 on the plurality of first conductive lines 120 and then, planarizing a top of the insulating material layer until top surfaces of the plurality of first conductive lines 120 are exposed.

Figure 11:
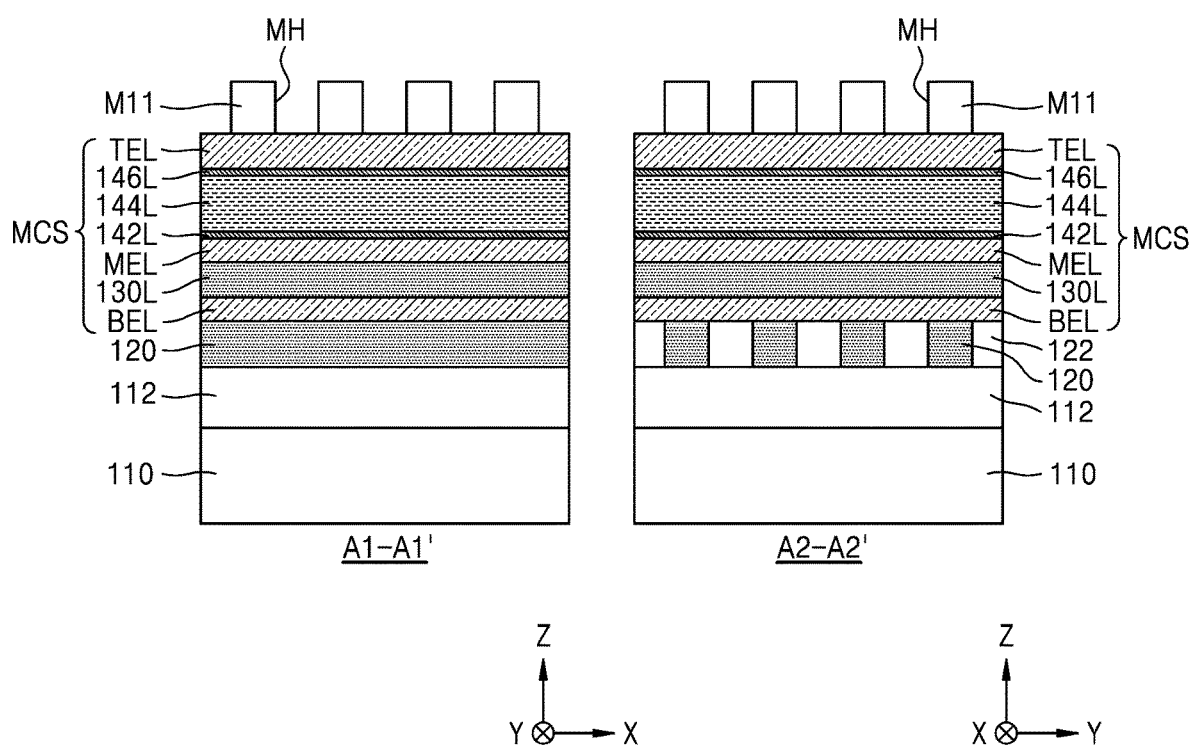

Referring to FIG. 11, the memory cell stack MCS may be formed on the plurality of first conductive lines 120 and the first insulating layer 122. The memory cell stack MCS may be formed by sequentially forming a bottom electrode layer BEL, a switching element layer 130L, a middle electrode layer MEL, a preliminary first barrier layer 142L, a preliminary variable resistance material layer 144L, a preliminary second barrier layer 146L, and a top electrode layer TEL.

Then, first mask patterns M11 may be formed on the memory cell stack MCS. The first mask patterns M11 may be in the form of a plurality of islands apart from one another in the first direction X and the second direction Y and openings MH may be arranged between the plurality of islands.

Figure 12:
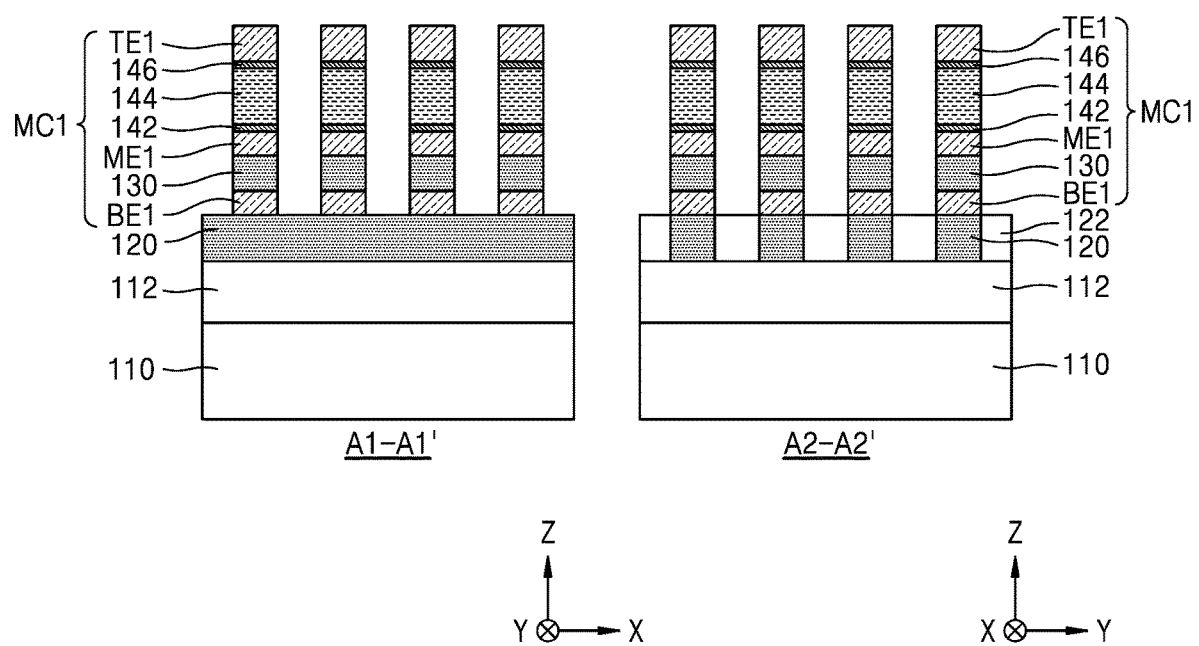

Referring to FIG. 12, the plurality of first memory cells MC1 may be formed by etching the memory cell stack MCS (refer to FIG. 11) by using the first mask patterns M11 as etching masks.

Each of the plurality of first memory cells MC1 may include the bottom electrode BE1, the switching element 130, the middle electrode ME1, the first barrier layer 142, the variable resistance material layer 144, the second barrier layer 146, and the top electrode TE1 sequentially arranged on each of the plurality of first conductive lines 120 in the third direction Z.

In example embodiments, in a process of forming the plurality of first memory cells MC1 by etching the memory cell stack MCS, upper side walls of the memory cell stack MCS may be more exposed to and damaged by an etching atmosphere so that each of the plurality of first memory cells MC1 may have inclined side walls tapered upwards and an upper width of each of the plurality of first memory cells MC1 may be less than a lower width thereof.

In other embodiments, upper side walls of each of the plurality of first memory cells MC1 may be formed by etching a part of the memory cell stack MCS first by using the first mask patterns M11 as the etching masks, insulation liners (not shown) may be formed on the upper side walls of each of the plurality of first memory cells MC1, and then, lower side walls of each of the plurality of first memory cells MC1 may be formed by etching the remaining part of the memory cell stack MCS.

Figure 13:
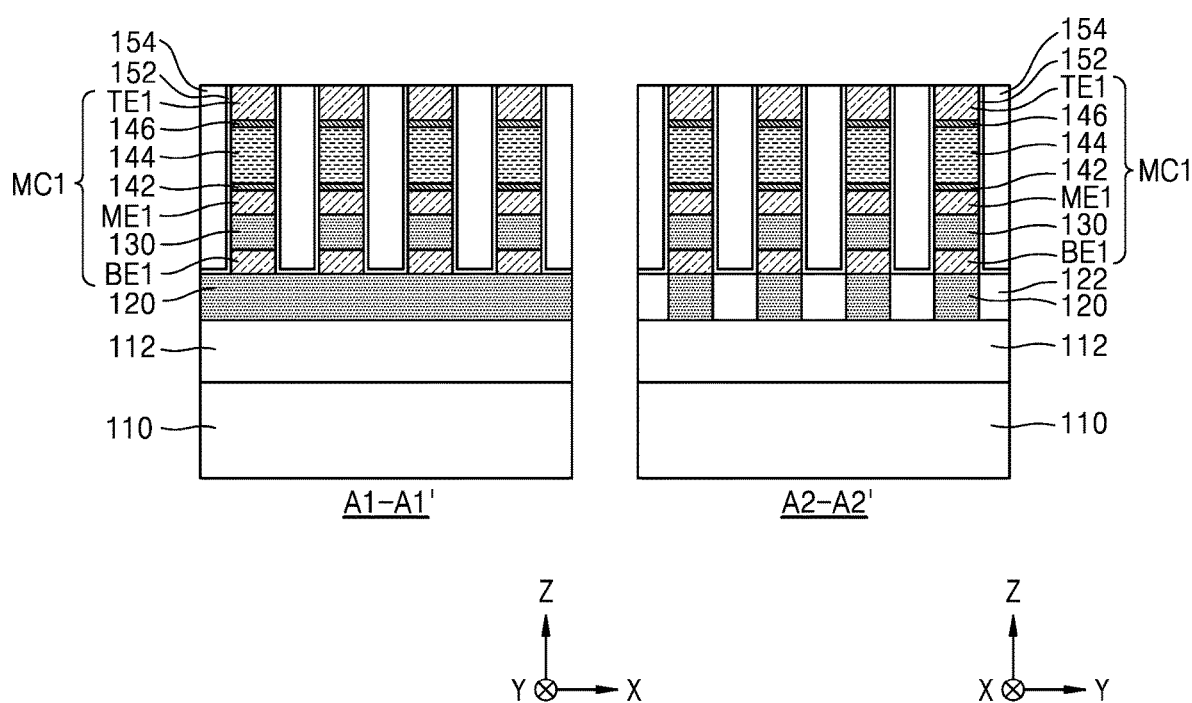

Referring to FIG. 13, the insulation liners 152 covering the side walls of each of the plurality of first memory cells MC1 may be formed first, and the insulation buried layer 154 may be formed by forming an insulating layer (not shown) in (e.g., filling) the spaces between the plurality of first memory cells MC1 on the insulation liners 152, and planarizing a top of the insulating layer until top surfaces of the plurality of first memory cells MC1 are exposed.

Figure 14:
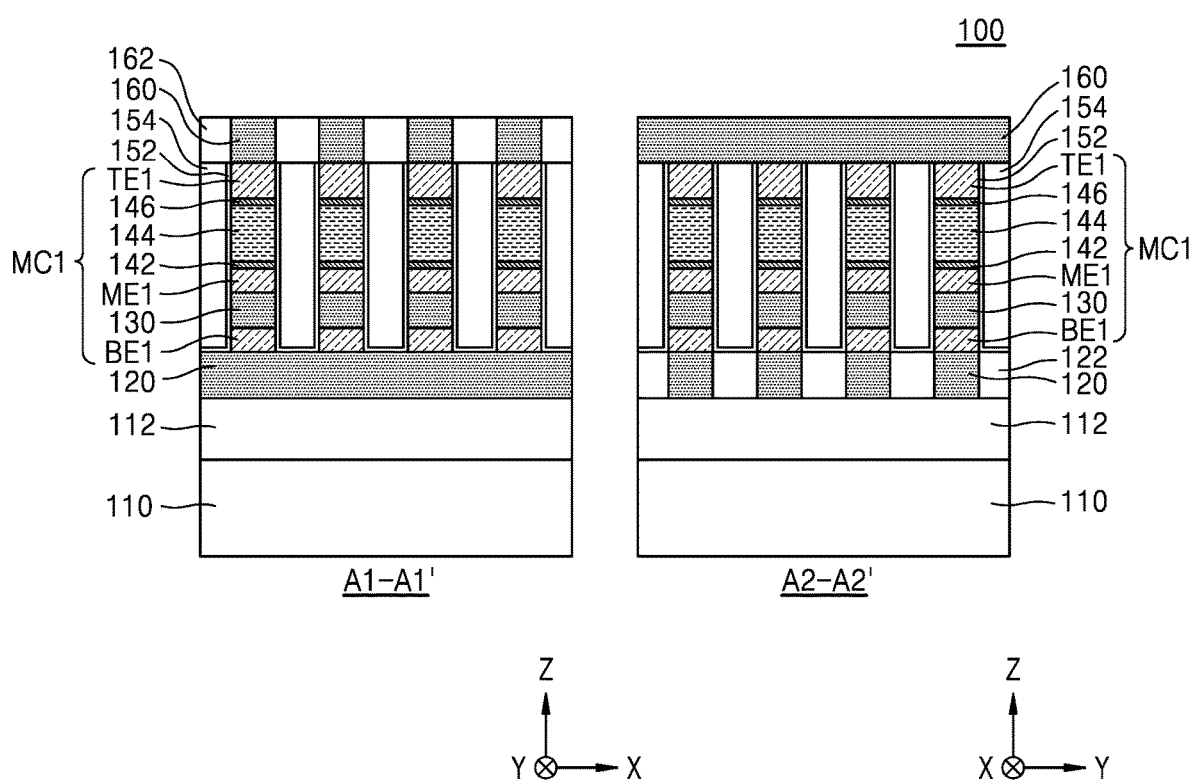

Referring to FIG. 14, the plurality of second conductive lines 160 extending in the second direction Y and the second insulating layer 162 in (e.g., filling) the spaces between the plurality of second conductive lines 160 may be formed on the plurality of first memory cells MC1 and the insulation buried layer 154.

The memory device 100 may be completed by performing the above-described processes.

While the inventive concept has been particularly shown and described with reference to embodiments thereof, it will be understood that various changes in form and details may be made therein without departing from the scope of the following claims.

What is claimed is:

1. A memory device comprising:
a plurality of first conductive lines on a substrate and extending in a first direction;
a plurality of second conductive lines on the plurality of first conductive lines and extending in a second direction intersecting the first direction; and
a plurality of memory cells respectively between the plurality of first conductive lines and the plurality of second conductive lines,
wherein each of the plurality of memory cells comprises a switching element and a variable resistance material layer, and
wherein the switching element comprises a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

2. The memory device of claim 1,
wherein $0.20 \leq X \leq 0.45$, $0.20 \leq Y \leq 0.45$, $0.35 \leq Z \leq 0.60$, and $0.01 \leq W \leq 0.05$, and
wherein the switching element does not include arsenic.

3. The memory device of claim 1, wherein each of the plurality of memory cells comprises:
a bottom electrode on a conductive line of the plurality of first conductive lines;
the switching element on the bottom electrode;
a middle electrode on the switching element, wherein the switching element is between the bottom electrode and the middle electrode;
the variable resistance material layer on the middle electrode; and
a top electrode on the variable resistance material layer, wherein the variable resistance material layer is between the middle electrode and the top electrode.

4. The memory device of claim 3, wherein each of the plurality of memory cells further comprises:
a first barrier layer between the middle electrode and the variable resistance material layer; and
a second barrier layer between the variable resistance material layer and the top electrode.

5. The memory device of claim 3, wherein the variable resistance material layer has inclined side walls,
wherein a width of a top surface of the variable resistance material layer is less than that of a bottom surface of the variable resistance material layer,
wherein the switching element has inclined side walls, and
wherein a width of a top surface of the switching element is less than that of a bottom surface of the switching element.

6. The memory device of claim 1, wherein each of the plurality of memory cells comprises:
a bottom electrode on a conductive line of the plurality of first conductive lines;
the variable resistance material layer on the bottom electrode;
a middle electrode on the variable resistance material layer, wherein the variable resistance material layer is between the bottom electrode and the middle electrode;
the switching element on the middle electrode; and
a top electrode on the switching element, wherein the switching element is between the middle electrode and the top electrode.

7. The memory device of claim 6, wherein each of the plurality of memory cells further comprises:
a first barrier layer between the bottom electrode and the variable resistance material layer; and
a second barrier layer between the variable resistance material layer and the middle electrode.

8. The memory device of claim 3, wherein each of the bottom electrode, the middle electrode, and the top electrode comprises W, Ti, Ta, Al, Cu, C, CN, TiN, TiAlN, TiSiN, TiCN, TiCSiN, WN, CoSiN, WSiN, TaN, TaCN, or TaSiN, or a combination thereof.

9. The memory device of claim 1, further comprising peripheral circuits under the plurality of first conductive lines on the substrate and configured to drive the plurality of memory cells.

10. The memory device of claim 1, further comprising:
spacers on side walls of the variable resistance material layer;
insulation liners on side walls of the spacers; and
an insulation buried layer on the insulation liners, wherein the insulation buried layer is in a space between two adjacent memory cells of the plurality of memory cells.

11. A memory device comprising:
a plurality of first word lines on a substrate and extending in a first direction;
a plurality of first bit lines at a vertical level higher than that of the plurality of first word lines and extending in a second direction intersecting the first direction;
a plurality of second word lines at a vertical level higher than that of the plurality of first bit lines and extending in the first direction; and
a plurality of memory cells comprising:
a plurality of first memory cells respectively between the plurality of first word lines and the plurality of first bit lines; and
a plurality of second memory cells respectively between the plurality of first bit lines and the plurality of second word lines,
wherein each of the plurality of memory cells comprises a switching element and a variable resistance material layer, and
wherein the switching element comprises a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

12. The memory device of claim 11, wherein $0.20 \leq X \leq 0.45$, $0.20 \leq Y \leq 0.45$, $0.35 \leq Z \leq 0.60$, and $0.01 \leq W \leq 0.05$.

13. The memory device of claim 11,
wherein each of the plurality of first memory cells comprises:
a first bottom electrode on a word line of the plurality of first word lines;
a first switching element on the first bottom electrode;
a first middle electrode on the first switching element;
a first variable resistance material layer on the first middle electrode; and
a first top electrode on the first variable resistance material layer, and
wherein each of the plurality of second memory cells comprises:
a second bottom electrode on a bit line of the plurality of first bit lines;
a second switching element on the second bottom electrode;
a second middle electrode on the second switching element;
a second variable resistance material layer on the second middle electrode; and
a second top electrode on the second variable resistance material layer.

14. The memory device of claim 13, wherein each of the first and second bottom electrodes, the first and second middle electrodes, and the first and second top electrodes comprises W, Ti, Ta, Al, Cu, C, CN, TiN, TiAlN, TiSiN, TiCN, TiCSiN, WN, CoSiN, WSiN, TaN, TaCN, or TaSiN, or a combination thereof.

15. The memory device of claim 11, further comprising peripheral circuits under the plurality of first word lines on the substrate and configured to drive the plurality of memory cells.

16. The memory device of claim 11, further comprising:
a plurality of second bit lines at a vertical level higher than that of the plurality of second word lines and extending in the second direction; and
a plurality of third word lines at a vertical level higher than that of the plurality of second bit lines and extending in the first direction,
wherein the plurality of memory cells further comprises:
a plurality of third memory cells respectively between the plurality of second word lines and the plurality of second bit lines; and
a plurality of fourth memory cells respectively between the plurality of second bit lines and the plurality of third word lines.

17. A memory device comprising:
a lower structure on a substrate and including a peripheral circuit;
a plurality of first conductive lines on the lower structure and extending in a first direction parallel with a top surface of the substrate;
a plurality of second conductive lines on the plurality of first conductive lines and extending in a second direction intersecting the first direction;
a plurality of first memory cells respectively between the plurality of first conductive lines and the plurality of second conductive lines;
a plurality of third conductive lines on the plurality of second conductive lines and extending in the first direction; and
a plurality of second memory cells respectively between the plurality of second conductive lines and the plurality of third conductive lines,
wherein each of the plurality of first memory cells and the plurality of second memory cells comprises a bottom electrode, a switching element, a middle electrode, a variable resistance material layer, and a top electrode sequentially stacked in a third direction perpendicular to the top surface of the substrate,
wherein the switching element comprises a material having a composition of $[Ge_X P_Y Se_Z]_{(1-W)} [O]_W$, where $0.15 \leq X \leq 0.50$, $0.15 \leq Y \leq 0.50$, $0.35 \leq Z \leq 0.70$, and $0.01 \leq W \leq 0.10$.

18. The memory device of claim 17, wherein $0.20 \leq X \leq 0.45$, $0.20 \leq Y \leq 0.45$, $0.35 \leq Z \leq 0.60$, and $0.01 \leq W \leq 0.05$.

19. The memory device of claim 17, further comprising:
insulation liners on side walls of two adjacent first memory cells among the plurality of first memory cells; and
an insulation buried layer in a space between the two adjacent first memory cells on the insulation liners.

20. The memory device of claim 19, further comprising spacers on side walls of the variable resistance material layer included in each of the plurality of first memory cells and covered with the insulation liners,
   wherein the lower structure comprises a recess between two adjacent first conductive lines among the plurality of first conductive lines,
   wherein the insulation liners extend onto side walls of the two adjacent first conductive lines and into the recess.

\* \* \* \* \*